(12) United States Patent
Chen et al.

(10) Patent No.: US 9,355,928 B2
(45) Date of Patent: May 31, 2016

(54) PACKAGE-ON-PACKAGE STRUCTURE

(71) Applicant: Taiwan Semiconductor Manufacturing Company, Ltd.

(72) Inventors: Yu-Feng Chen, Hsin-Chu (TW); Han-Ping Pu, Taichung (TW); Chun-Hung Lin, Taipei (TW); Chun-Cheng Lin, New Taipei (TW); Ming-Da Cheng, Jhubei (TW); Kai-Chiang Wu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/164,673

(22) Filed: Jan. 27, 2014

(65) Prior Publication Data

US 2014/0264849 A1 Sep. 18, 2014

Related U.S. Application Data

(60) Provisional application No. 61/777,960, filed on Mar. 12, 2013.

(51) Int. Cl.
| | |
|---|---|
| *H01L 23/00* | (2006.01) |
| *H01L 23/31* | (2006.01) |
| *H01L 25/10* | (2006.01) |
| *H01L 25/00* | (2006.01) |
| *H01L 21/56* | (2006.01) |

(52) U.S. Cl.
CPC .......... *H01L 23/3128* (2013.01); *H01L 25/105* (2013.01); *H01L 25/50* (2013.01); *H01L 21/56* (2013.01); *H01L 24/81* (2013.01); *H01L 2224/131* (2013.01); *H01L 2224/13147* (2013.01); *H01L 2224/16237* (2013.01); *H01L 2224/2919* (2013.01); *H01L 2224/48227* (2013.01); *H01L 2224/73204* (2013.01); *H01L 2224/81815* (2013.01); *H01L 2224/83102* (2013.01); *H01L 2225/1023* (2013.01); *H01L 2225/1041* (2013.01); *H01L 2225/1058* (2013.01)

(58) Field of Classification Search
CPC ............................... H01L 24/14; H01L 24/81
USPC ........................................... 438/126; 257/737
See application file for complete search history.

(56) References Cited

U.S. PATENT DOCUMENTS

| | | | | |
|---|---|---|---|---|
| 6,391,682 | B1* | 5/2002 | Tsai et al. ..................... 438/108 |
| 2007/0007639 | A1* | 1/2007 | Fukazawa ..................... 257/686 |
| 2007/0158856 | A1* | 7/2007 | Narkhede et al. ............. 257/778 |
| 2009/0127686 | A1* | 5/2009 | Yang ....................... H01L 24/18 |
| | | | | 257/686 |
| 2009/0309238 | A1* | 12/2009 | Loke .................... H01L 21/563 |
| | | | | 257/778 |

(Continued)

*Primary Examiner* — Christine Enad
(74) *Attorney, Agent, or Firm* — Slater Matsil, LLP (57) ABSTRACT

A device comprises a bottom package mounted on a printed circuit board, wherein the bottom package comprises a plurality of first bumps formed between the bottom package and the printed circuit board, a first underfill layer formed between the printed circuit board and the bottom package, a semiconductor die mounted on the bottom package and a top package bonded on the bottom package, wherein the top package comprises a plurality of second bumps and the top package and the bottom package form a ladder shaped structure. The device further comprises a second underfill layer formed between the bottom package and the top package, wherein the second underfill layer is formed of a same material as the first underfill layer.

20 Claims, 6 Drawing Sheets

(56) References Cited

U.S. PATENT DOCUMENTS

| | | | |
|---|---|---|---|
| 2011/0074047 A1* | 3/2011 | Pendse | H01L 24/03 257/782 |
| 2012/0020040 A1* | 1/2012 | Lin et al. | 361/772 |
| 2012/0135565 A1* | 5/2012 | Yamato | H01L 21/561 438/107 |
| 2012/0211885 A1* | 8/2012 | Choi et al. | 257/737 |

* cited by examiner

PACKAGE-ON-PACKAGE STRUCTURE

This application claims the benefit of U.S. Provisional Application No. 61/777,960 filed on Mar. 12, 2013, entitled "Package-on-Package Structure" which is hereby incorporated herein by reference in its entirety.

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrink the process node towards the sub-20 nm node). As the demand for miniaturization, higher speed and greater bandwidth, as well as lower power consumption and latency has grown recently, there has grown a need for smaller and more creative packaging techniques of semiconductor dies.

As semiconductor technologies further advance, package-on-package semiconductor devices have emerged as an effective alternative to further reduce the physical size of a semiconductor device. In a package on package semiconductor device, active circuits such as logic, memory, processor circuits and the like are fabricated on different wafers and packages. Two or more packages are installed on top of one another, i.e. stacked, with a standard interface to route signals between them. Much higher density can be achieved by employing package on package semiconductor devices. Furthermore, package on package semiconductor devices can achieve smaller form factors, cost-effectiveness, increased performance and lower power consumption.

The standard interface of a package-on-package semiconductor device may comprise a plurality of bumps such as ball grid array (BGA) balls. The bumps provide electrical conductive paths between different wafers and packages. In addition, the bumps also provide addition mechanical support for the stacked packages.

The bumps are susceptible to failures caused by stresses. In order to prevent the bump failures, underfill layers may be used to protect the bumps. More particularly, the underfill layers formed between different wafers and packages are used to increase the reliability of the stacked packages by reducing stresses on the bumps. The underfill layer may be formed by a capillary dispensing method, where liquid underfill material flows beneath the packages by capillary action.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale

DETAILED DESCRIPTION OF ILLUSTRATIVE EMBODIMENTS

The making and using of the presently embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to embodiments in a specific context, namely a ladder shaped package-on-package semiconductor device. The embodiments of the disclosure may also be applied, however, to a variety of semiconductor devices. Hereinafter, various embodiments will be explained in detail with reference to the accompanying drawings.

Figure 1:
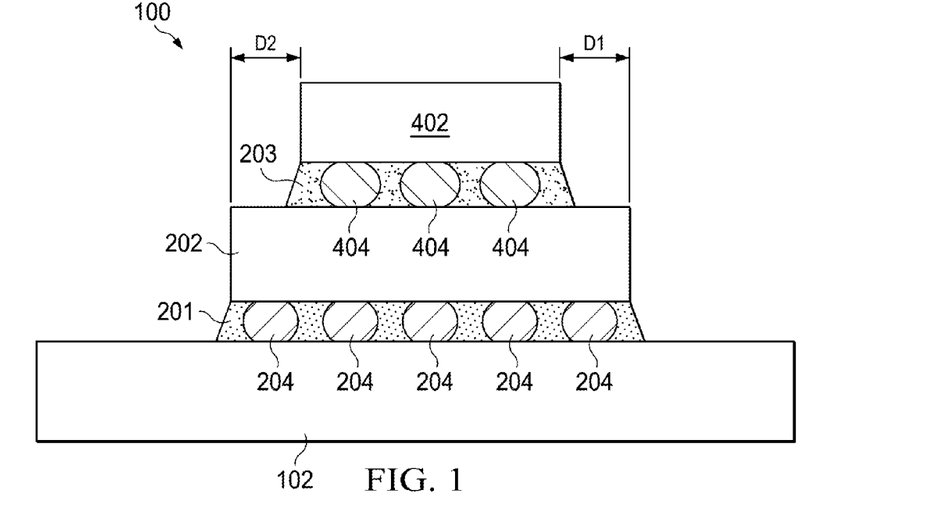
FIG. 1 illustrates a cross sectional view of a package-on-package semiconductor device in accordance with various embodiments of the present disclosure.

FIG. 1 illustrates a cross sectional view of a package-on-package semiconductor device in accordance with various embodiments of the present disclosure. The package-on-package semiconductor device 100 may include a bottom package 202 and a top package 402. In particular, the top package 402 is stacked on top of the bottom package 202. In addition, the top package 402 and the bottom package 202 form a ladder shaped package-on-package structure, which is bonded on a printed circuit board 102. Alternatively, the top package 402 and the bottom package 202 may form a step pyramid shaped package-on-package structure as shown in FIG. 1.

As shown in FIG. 1, the bottom package 202 may be a first step of the ladder and the top package 402 may be a second step of the ladder. There may be two horizontal gaps between these two steps. As shown in FIG. 1, a first horizontal gap is denoted as D1 and a second horizontal gap is denoted as D2. In some embodiments, D1 is equal to D2. Alternatively, D1 may be not equal to D2 depending on different design needs and applications. The dimension of D1 and D2 will be described in detail below with respect to FIG. 2.

FIG. 1 further illustrates that there may be a plurality of first bumps 204 formed between the printed circuit board 102 and the bottom package 202. In addition, there may be a plurality of second bumps 404 formed between the top package 402 and the bottom package 202. In accordance with some embodiments, the first bumps 204 and second bump 404 may be ball grid array (BGA) balls. The first bumps 204 may be high density BGA balls. The first bumps 204 may be of a pitch less than or equal to 0.5 mm. The second bumps 404 may be low density BGA balls. The second bumps 404 may be of a pitch less than or equal to 0.65 mm according to some embodiments. Alternatively, the first bumps 204 and the second bumps 404 may be formed of conductive materials such as copper, nickel, any combinations thereof and/or the like.

As shown in FIG. 1, a second underfill layer 203 is formed between the top package 402 and the bottom package 202. The top package 402 and the bottom package 202 form the package-on-package semiconductor device 100. As shown in FIG. 1, the package-on-package semiconductor device 100 is stacked on the printed circuit board 102. In addition, a first underfill layer 201 is formed between the package-on-package semiconductor device 100 and the printed circuit board 102. The first bumps 204 are embedded in the first underfill layer 201. Likewise, the second bumps 404 are embedded in the second underfill layer 203. It should be noted that the number of bumps shown in FIG. 1 is merely an example. A person skilled in the art will recognize that the package-on-package semiconductor device 100 may accommodate any number of bumps.

It should further be noted that both the first underfill layer 201 and the second underfill layer 203 may be formed of a same underfill material and formed by a single fabrication step such as an underfill dispensing step. The detailed fabrication process of the first underfill layer 201 and the second underfill layer 203 will be described below with respect to FIG. 8.

Figure 2:
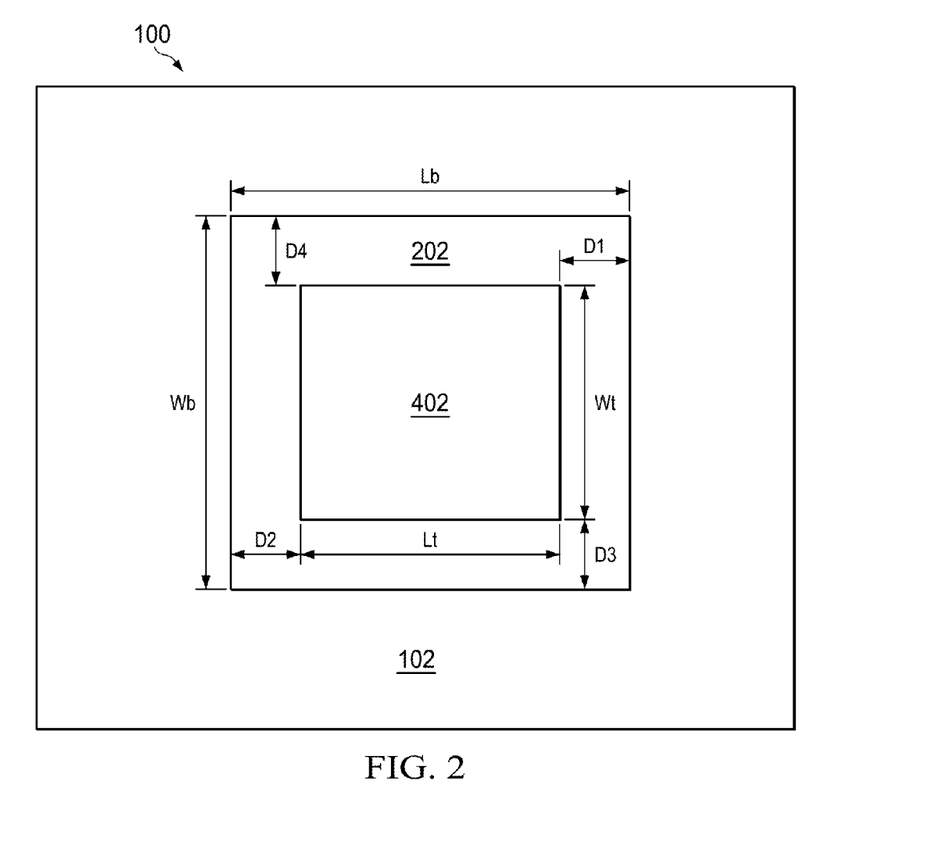
FIG. 2 illustrates a top view of the package-on-package semiconductor device shown in FIG. 1 in accordance with various embodiments of the present disclosure.

FIG. 2 illustrates a top view of the package-on-package semiconductor device shown in FIG. 1 in accordance with various embodiments of the present disclosure. A top view of the package-on-package semiconductor device 100 shows the top package 402 is stacked on top of the bottom package 202 to form a package-on-package structure, which is mounted on the printed circuit board 102.

As shown in FIG. 2, the top package 402 is smaller than the bottom package 202. More particularly, as shown in FIG. 2, a first side of the top package 402 may be of a first dimension Lt. A second side of the top package 402 may be of a second dimension Wt. Likewise, a first side of the bottom package 202 may be of a third dimension Lb. A second side of the bottom package 202 may be of a fourth dimension Wb. In some embodiments, Lb and Wb are approximately equal to 10 mm. Lt and Wt are slightly less than 10 mm.

In addition, because the top package 402 is smaller than the bottom package 202, there may be four gaps D1, D2, D3 and D4 as shown in FIG. 2. As shown in the top view, the distance between a right edge of the top package 402 and a right edge of the bottom package 202 is denoted as D1. The distance between a left edge of the top package 402 and a left edge of the bottom package 202 is denoted as D2. Likewise, the distance between a bottom edge of the top package 402 and a bottom edge of the bottom package 202 is denoted as D3. The distance between a top edge of the top package 402 and a top edge of the bottom package 202 is denoted as D4.

In some embodiments, D1 may be equal to D2 and D3 may be equal to D4. As such, D1 and D2 may be equal to one half of the difference between Lb and Lt. Likewise, D3 and D4 may be equal to one half of the difference between Wb and Wt. Alternatively, depending on different applications and design needs, the gaps D1, D2, D3 and D4 may be not equal to each other.

In some embodiments, the gaps (e.g., D1, D2, D3 and D4) may be subject to the following restriction. D1, D2, D3 and D4 are greater than or equal to one half of a diameter of an underfill dispensing head (not shown but illustrated in FIG. 8). Alternatively, D1, D2, D3 and D4 are greater than or equal to one half of a diameter of an underfill droplet (not shown but illustrated in FIG. 8). In some embodiments, the droplet is of a diameter of about 75 um. As such, D1, D2, D3 and D4 are greater than or equal to 37.5 um.

In alternative embodiments, the dimensions (e.g., D1, D2, D3 and D4) may be subject to another restriction. At least one gap (e.g., D1, D2, D3 or D4) is greater than or equal to one half of a diameter of an underfill dispensing head.

FIGS. 3-9 illustrate intermediate steps of fabricating the package-on-package semiconductor device shown in FIG. 1 in accordance with various embodiments of the present disclosure. It should be noted that the fabrication steps as well as the package-on-package structure shown in FIGS. 3-9 are merely an example. A person skilled in the art will recognize there may be many alternatives, variations and modifications.

Figure 3:
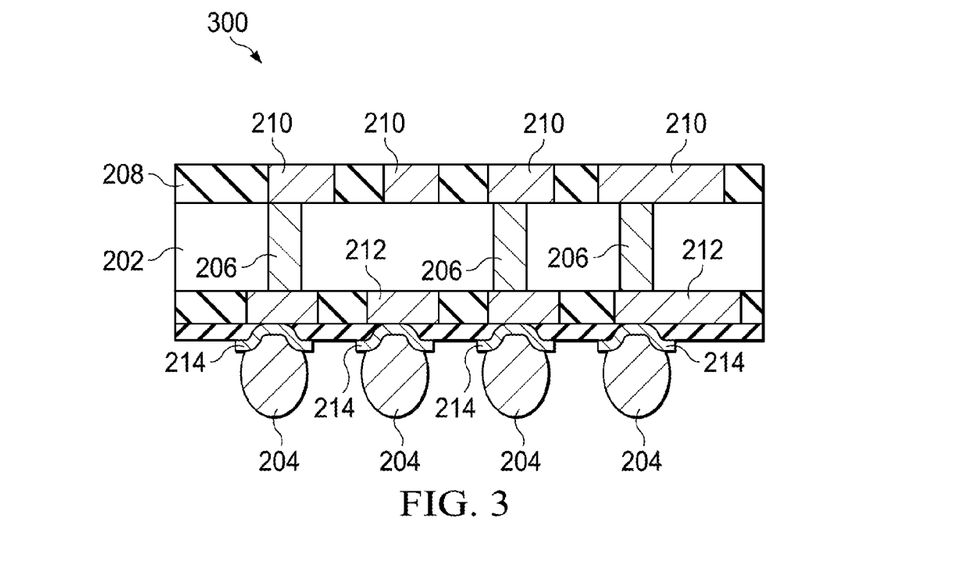
FIG. 3 illustrates a cross sectional view of a bottom package in accordance with various embodiments of the present disclosure.

FIG. 3 illustrates a cross sectional view of a bottom package in accordance with various embodiments of the present disclosure. The bottom package 202 may be a silicon substrate. Alternatively, the bottom package 202 may a glass interposer.

In some embodiments, the bottom package 202 may be formed of silicon, although it may also be formed of other group III, group IV, and/or group V elements, such as silicon, germanium, gallium, arsenic, and combinations thereof. The bottom package 202 may comprise a bulk substrate or a silicon-on-insulator (SOI) substrate.

According to alternative embodiments, the bottom package 202 may be made of other suitable materials such as ceramic materials, organic materials, any combinations thereof and/or the like.

The bottom package 202 may comprise a plurality of integrated circuits (not shown), each of which may comprise various layers such as active circuit layers, substrate layers, inter-layer dielectric (ILD) layers and inter-metal dielectric (IMD) layers (not shown respectively). The bottom package 202 may further comprise a plurality of through vias. In some embodiments, the through vias are through-substrate vias (TSVs) or through-silicon vias (TSVs), such as TSVs 206. The TSV 206 may be filled with a conductive material such as copper, tungsten and/or the like. The active circuit layers (not shown) of the bottom package 202 may be coupled to external circuits (not shown) formed over the bottom package 202 through the plurality of TSVs (e.g., TSV 206).

A dielectric layer 208 is formed over the bottom package 202. The dielectric layer 208 may be alternatively referred to as an ILD layer 208 hereinafter. In some embodiments, the ILD layer 208 is formed of a photo-sensitive material such as polybenzoxazole (PBO), polyimide, benzocyclobutene (BCB), any combinations thereof and/or the like, which may be easily patterned using a lithography mask. In alternative embodiments, the ILD layer 208 may be formed of a nitride such as silicon nitride, an oxide such as silicon oxide, phosphosilicate glass (PSG), borosilicate glass (BSG), boron-doped phosphosilicate glass (BPSG), any combinations thereof and/or the like. The ILD layer 208 may be formed by suitable fabrication techniques such as such as spinning, chemical vapor deposition (CVD), and plasma enhanced CVD (PECVD) and/or the like.

As shown in FIG. 3, a first redistribution layer 210 is formed over a first side of the bottom package 202. More particularly, the first redistribution layer 210 provides a conductive path between TSVs (e.g., TSV 206) and the metal bumps subsequently formed over the bottom package 202. The first redistribution layer 210 may be formed of metal materials such as aluminum, aluminum alloys, copper or copper alloys and the like.

A second redistribution layer 212 may be formed on a second side of the bottom package 202. The material and the formation method of the second redistribution layer 212 may be similar to that of the first redistribution layer 210 described above. Therefore, explicit description of the formation of the second redistribution layer 212 is omitted to avoid unnecessary repetition.

FIG. 3 further illustrates a plurality of under bump metallization (UBM) structures 214 and the first bumps 204 are formed over the second side of the bottom package 202. The plurality of UBM structures 214 are formed over the second redistribution layer 212. The UBM structures 214 help to prevent diffusion between the first bumps 204 (formed of solder) and the integrated circuits of the semiconductor device, while providing a low resistance electrical connection.

The first bumps 204 are input/output (I/O) pads of the bottom package 202. In accordance with an embodiment, the first bumps 204 may be a plurality of solder balls. In some embodiments, the solder balls may comprise SAC405. SAC405 comprises 95.5% Sn, 4.0% Ag and 0.5% Cu. Alternatively, the first bumps 204 may be a plurality of ball grid array (BGA) balls.

Figure 4:
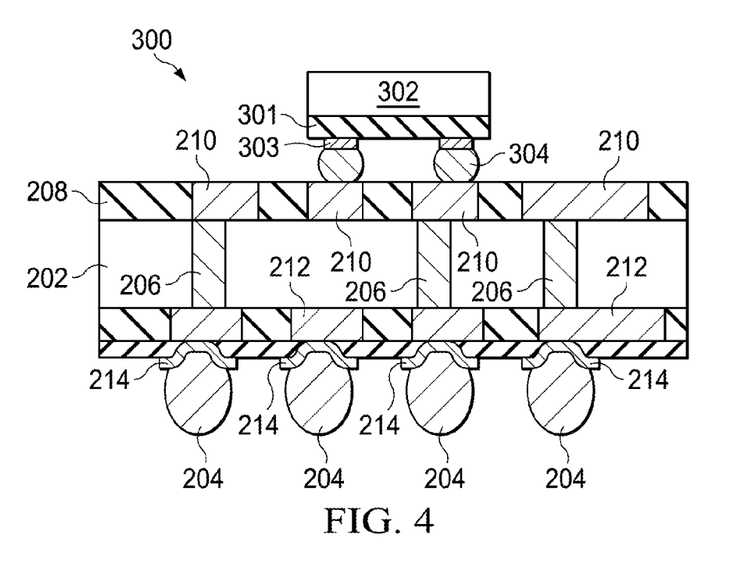
FIG. 4 illustrates a cross sectional view of the semiconductor device shown in FIG. 3 after a semiconductor die is mounted on the bottom package in accordance with various embodiments of the present disclosure.

FIG. 4 illustrates a cross sectional view of the semiconductor device shown in FIG. 3 after a semiconductor die is mounted on the bottom package in accordance with various embodiments of the present disclosure. A semiconductor die 302 is picked and placed on top of the bottom package 202. After a reflow process, the semiconductor die 302 is bonded on the bottom package 202 through the bumps 304, which are coupled between the bottom package 202 and the semiconductor die 302.

In some embodiments, the bonding process may be a bump on trace (BOT) process. The detailed processes of bonding semiconductor dies on a bottom package are well known in the art, and hence are not discussed herein. It should be noted that while FIG. 4 illustrates a single semiconductor die bonded on the bottom package 202, the bottom package 202 may accommodate any number of semiconductor dies.

In order to give a basic insight of the inventive aspects of various embodiments, the semiconductor die 302 is drawn without details. However, it should be noted that the semiconductor die 302 may comprise basic semiconductor layers such as active circuit layers, substrate layers, ILD layers and IMD layers (not shown respectively).

The semiconductor die 302 may comprise a substrate (not shown). The substrate may be a silicon substrate. Alternatively, the substrate may be a silicon-on-insulator substrate. The substrate may further comprise a variety of electrical circuits (not shown). The electrical circuits formed on the substrate may be any type of circuitry suitable for a variety of applications such as logic circuits.

In some embodiments, the electrical circuits may include various n-type metal-oxide semiconductor (NMOS) and/or p-type metal-oxide semiconductor (PMOS) devices such as transistors, capacitors, resistors, diodes, photo-diodes, fuses and the like. The electrical circuits may be interconnected to perform one or more functions. The functions may include memory structures, processing structures, sensors, amplifiers, power distribution, input/output circuitry or the like. One of ordinary skill in the art will appreciate that the above examples are provided for illustrative purposes only to further explain applications of the present disclosure and are not meant to limit the present disclosure in any manner.

An isolation layer 301 is formed on the substrate. The isolation layer 301 may be formed, for example, of a dielectric material, such as silicon oxide. The isolation layer 301 may be formed by any suitable method known in the art, such as spinning, CVD, PECVD and the like. It should also be noted that one skilled in the art will recognize that the isolation layer 301 may further comprise a plurality of dielectric layers.

A redistribution layer 303 is formed on the isolation layer 301. The active circuit layer (not shown) of the semiconductor die 302 may be bridged by the redistribution layer 303 so that the active circuit layer of the semiconductor die 302 can be coupled to the input and output terminals of the semiconductor die 302. A plurality of UBM structures (not shown) may be formed on the redistribution layer 303. The UBM structures may help to prevent diffusion between the bumps (e.g., bumps 304) and the integrated circuits of the semiconductor die 302, while providing a low resistance electrical connection.

The bumps (e.g., bumps 304) provide an effective way to connect the semiconductor die 302 with the bottom package 202. The bumps are I/O terminals of the semiconductor die 302. In some embodiments, the bumps (e.g., bumps 304) may be a plurality of solder balls, which are commonly known as fine-pitch micro bumps. Alternatively, the bumps (e.g., bumps 304) may be a plurality of BGA balls. Furthermore, the bumps 304 may be formed of conductive materials such as copper, nickel, any combinations thereof and/or the like.

Figure 5:
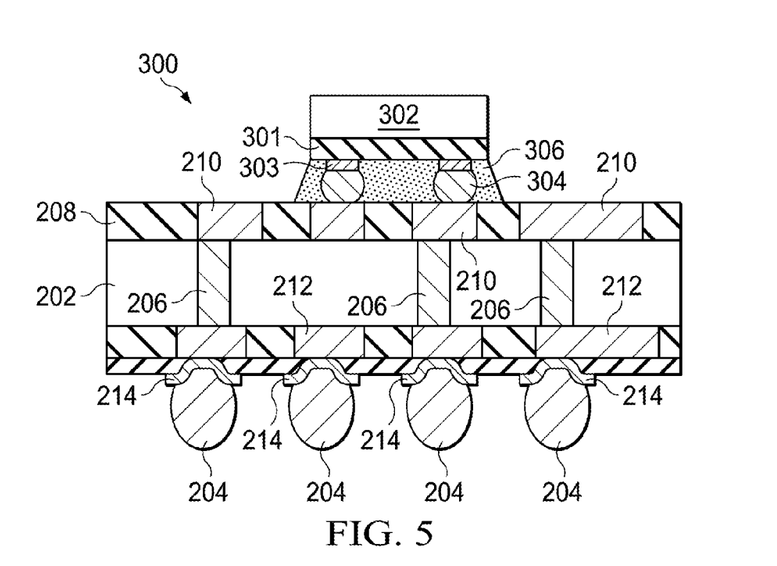
FIG. 5 illustrates a cross sectional view of the semiconductor device shown in FIG. 4 after an underfill layer is formed between the semiconductor die and the bottom package in accordance with various embodiments of the present disclosure.

FIG. 5 illustrates a cross sectional view of the semiconductor device shown in FIG. 4 after an underfill layer is formed between the semiconductor die and the bottom package in accordance with various embodiments of the present disclosure. In some embodiments, the underfill material layer 306 may be formed of an epoxy, which is dispensed at the gap between the bottom package 202 and the semiconductor die 302 to form the underfill layer 306. The epoxy may be applied in a liquid form, and may harden after a curing process. In alternative embodiments, the underfill layer 306 may be formed of curable materials such as polymer based materials, resin based materials, polyimide, epoxy and any combinations of thereof. The underfill layer 306 may be alternatively referred to as the molding compound layer 306 throughout the description.

The molding compound layer 306 can be formed by any suitable dispense techniques. Alternatively, the molding compound layer 306 may be formed by a spin-on coating process, dry film lamination process and/or the like. An advantageous feature of having the molding compound layer 306 is that the underfill material helps to prevent the bumps 304 from cracking. In addition, the underfill material may help to reduce the mechanical and thermal stresses on the semiconductor die 302 during the subsequent fabrication processes.

Figure 6:
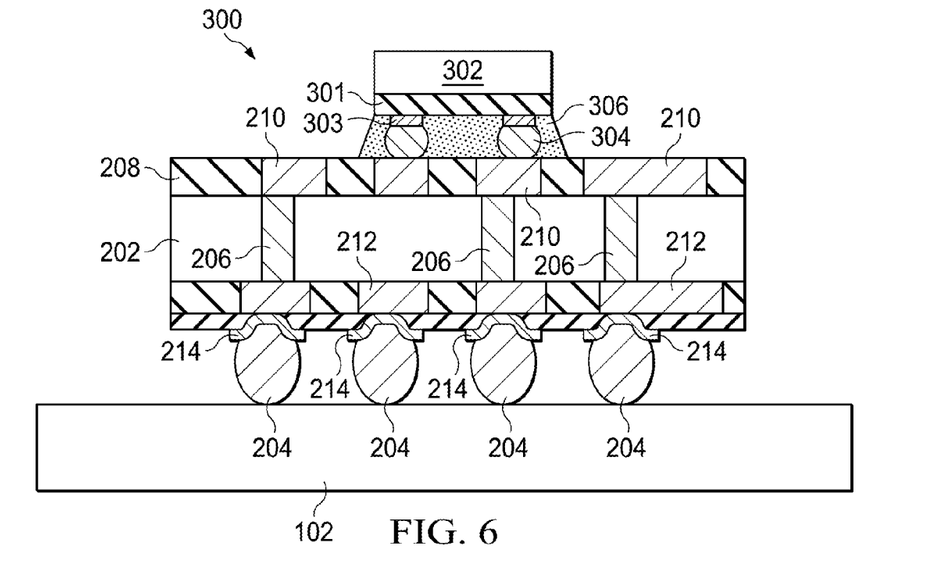
FIG. 6 illustrates a cross sectional view of the semiconductor device shown in FIG. 5 after the bottom package is mounted on a PCB in accordance with various embodiments of the present disclosure.

FIG. 6 illustrates a cross sectional view of the semiconductor device shown in FIG. 5 after the bottom package is mounted on a printed circuit board in accordance with various embodiments of the present disclosure. The bottom package 202 is picked and mounted the printed circuit board 102 as shown in FIG. 6. It should be noted that the printed circuit board 102 may be a screen-printed board. In addition, the first bumps 204 of the bottom package 202 may be dipped into flux or a paste material before the bottom package 202 is mounted on the printed circuit board 102.

Figure 7:
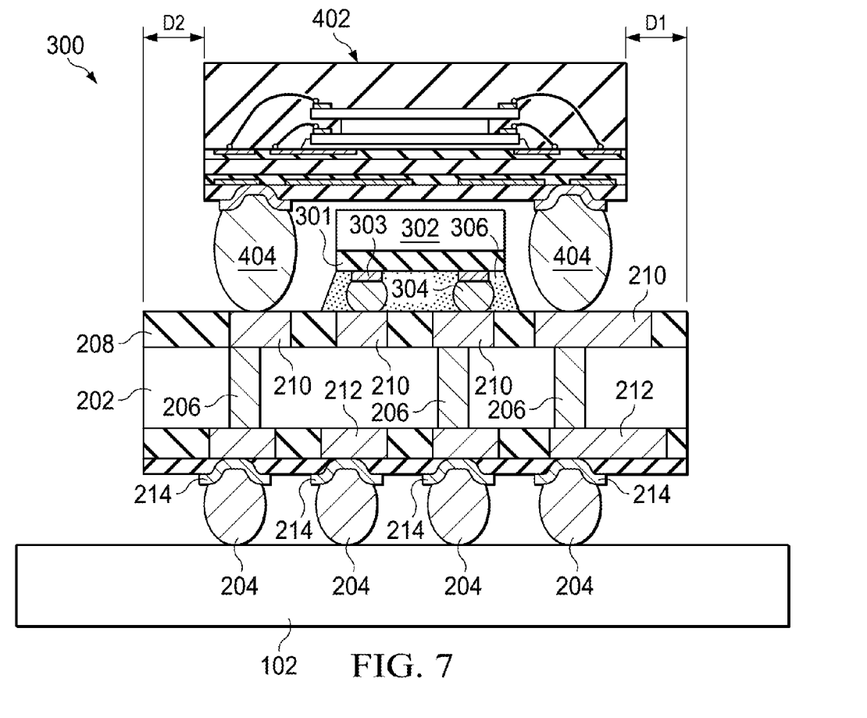
FIG. 7 illustrates a cross sectional view of the semiconductor device shown in FIG. 6 after a top package is mounted on the bottom package in accordance with various embodiments of the present disclosure.

FIG. 7 illustrates a cross sectional view of the semiconductor device shown in FIG. 6 after a top package is mounted on the bottom package in accordance with various embodiments of the present disclosure. The top package 402 may comprise a plurality of stacked dies, which may be wire bonded to the input and output terminals of the top package 402. The stacked dies of the top package 402 may comprise memory dies, logic dies, processor dies and/or the like. It should be noted while FIG. 7 illustrates two stacked dies in the top package 402, this is merely an example. Likewise, the use of wire bonding is merely illustrative and other approaches for electrically connecting the stacked dies are within the contemplated scope of the present disclosure.

As shown in FIG. 7, the top package 402 is smaller than the bottom package 202. The dimensions of D1 and D2 have been described above with respect to FIG. 2, and hence are not discussed again to avoid repetition.

Figure 8:
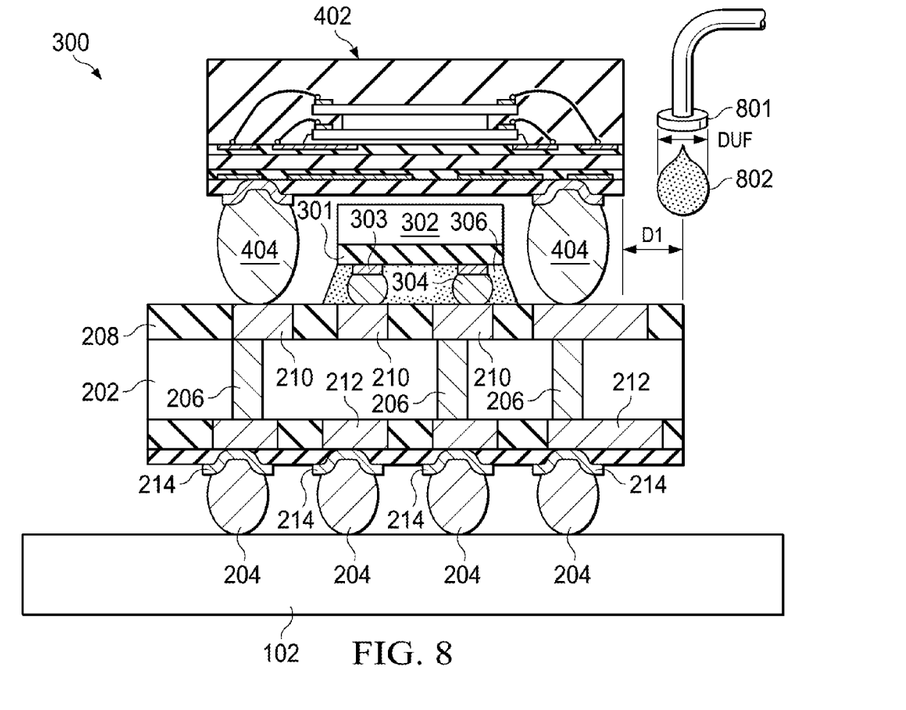
FIG. 8 illustrates a cross sectional view of the semiconductor device shown in FIG. 7 after an underfill dispensing process is applied to the semiconductor device in accordance with various embodiments of the present disclosure.

FIG. 8 illustrates a cross sectional view of the semiconductor device shown in FIG. 7 after an underfill dispensing process is applied to the semiconductor device in accordance with various embodiments of the present disclosure. The underfill material is dispensed from an underfill dispensing head 801. In accordance with some embodiments, the diameter of the underfill dispensing head 801 is in a range from about 75 um to about 150 um. The underfill droplet may be of a diameter approximately equal to the diameter of the underfill dispensing head 801.

As shown in FIG. 8, the top package 402 and the bottom package 202 form a ladder shaped package-on-package semiconductor device. Because the top package 402 is smaller than the bottom package 202, there may be a horizontal gap between the right edge of the top package 402 and the right edge of the bottom package 202. The horizontal gap D1 is greater than or equal to one half of the diameter of the underfill dispensing head 801. As such, the gap between two packages can accommodate half of the underfill dispensing head.

The underfill dispensing head 801 may be oriented so that the underfill droplet 802 is directed toward the right edge of the bottom package 202. The underfill material is dispensed along the edge of the bottom package 202 as well as the top surface of the bottom package 202. Due to capillary action, the underfill material flows beneath the top package 404 as well as the bottom package 202.

The underfill material may comprise epoxy or a polymer, although other materials may alternatively be used. After the underfill material is dispensed, a curing process may be performed to harden the underfill material.

One advantageous feature of having the ladder shaped package-on-package semiconductor device shown in FIG. 8 is that the ladder shaped structure helps to form two underfill layers within one single underfill dispensing step. Such a simplified underfill dispensing process helps to reduce cost and improve efficiency.

Figure 9:
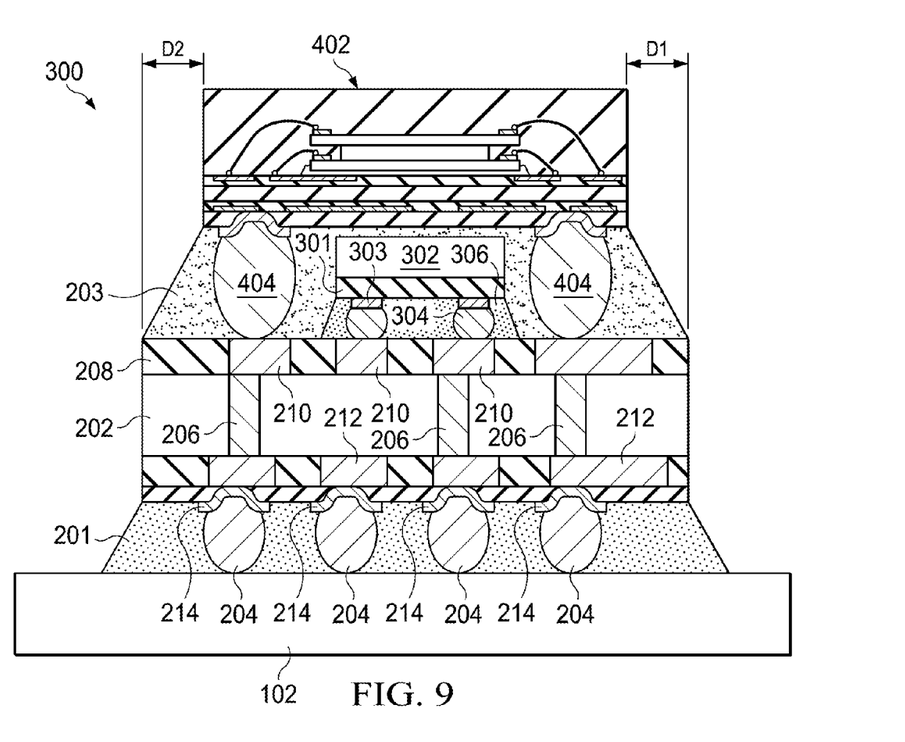
FIG. 9 illustrates a cross sectional view of the semiconductor device shown in FIG. 8 after two underfill layers are formed in accordance with various embodiments of the present disclosure.

FIG. 9 illustrates a cross sectional view of the semiconductor device shown in FIG. 8 after two underfill layers are formed in accordance with various embodiments of the present disclosure. As shown in FIG. 9, a first underfill layer 201 is formed between the printed circuit board 102 and the bottom package 202. A second underfill layer 203 is formed between the bottom package 202 and the top package 402. The underfill layers 201 and 203 may provide additional mechanical strength to the package-on-package semiconductor device 300. More particularly, the underfill layers 201 and 203 may function as buffers reducing the strain of the bumps (e.g., bumps 404 and 204).

In addition, the first underfill layer 201 and the second underfill layer 203 help to protect the bumps (e.g., bumps 204 and 404) from environmental hazards such as moisture and/or the like. Furthermore, the underfill layers 201 and 203 help the package-on-package semiconductor device 300 pass board level reliability tests such as 500 thermal cycling tests (TC 500), drop 150× tests and/or the like.

In accordance with an embodiment, a device comprises a printed circuit board, a bottom package mounted on the printed circuit board, wherein the bottom package comprises a plurality of first bumps, a first underfill layer formed between the printed circuit board and the bottom package, wherein the first bumps are embedded in the first underfill layer, a top package bonded on the bottom package, wherein the top package comprises a plurality of second bumps and a second underfill layer formed between the bottom package and the top package, wherein the second underfill layer is formed of a same material as the first underfill layer and the second bumps are embedded in the second underfill layer, and wherein the top package and the bottom package form a ladder shaped structure.

In accordance with an embodiment, an apparatus comprises a bottom package having a first width and a first length, a top package mounted on the bottom package, wherein the top package is of a second width and a second length, and wherein the first width is greater than the second width and the first length is greater than the second length, a first underfill layer formed between the top package and the bottom package and a second underfill layer formed underneath the bottom package, wherein the first underfill layer and the second underfill layer are formed of a same material.

In accordance with an embodiment, a method comprises attaching a semiconductor die on a first side of a bottom package, mounting the bottom package on a printed circuit board, mounting a top package on the bottom package, wherein the top package is smaller than the bottom package, and wherein the semiconductor die is located between the bottom package and the top package, applying a reflow process so that the bottom package and the top package form a package-on-package structure and applying a single underfill dispensing process to the package-on-package structure, wherein the single underfill dispensing process is applied to an edge of the bottom package.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
    attaching a semiconductor die on a first side of a bottom package;
    mounting the bottom package on a printed circuit board;
    mounting a top package on the bottom package, wherein the top package is smaller than the bottom package, and wherein the semiconductor die is located between the bottom package and the top package;

applying a reflow process so that the bottom package and the top package form a package-on-package structure; and applying a single underfill dispensing process to the package-on-package structure to form both a first underfill layer between the bottom package and the printed circuit board, and a second underfill layer between the top package and the bottom package, wherein the single underfill dispensing process is applied to an edge of the bottom package and an underfill dispensing head is vertically aligned with the edge of the bottom package during the single underfill dispensing process, and wherein through an alignment between the underfill dispensing head and the edge of the bottom package, the single underfill dispensing process can be used to form both the first underfill layer and the second underfill layer.

2. The method of claim 1, wherein:
the top package and the bottom package form a ladder shaped structure, and wherein a horizontal gap between the top package and the bottom package is approximately greater than or equal to one half of a diameter of a dispensing head used in the single underfill dispensing process.

3. The method of claim 1, wherein:
the top package and the bottom package form a ladder shaped structure, and wherein a horizontal gap between the top package and the bottom package is approximately greater than or equal to one half of a diameter of an underfill droplet in the single underfill dispensing process.

4. The method of claim 1, wherein:
the top package and the bottom package form a ladder shaped structure, and wherein a horizontal gap between the top package and the bottom package is approximately greater than or equal to about 37.5 um.

5. The method of claim 1, further comprising:
depositing a molding compound layer over the first side of the bottom package.

6. The method of claim 5, wherein:
the molding compound layer is located between the bottom package and the semiconductor die.

7. The method of claim 1, further comprising:
attaching the semiconductor die on the bottom package through a plurality of first micro bumps.

8. The method of claim 1, wherein:
the first underfill layer and the second underfill layer are formed through capillary action in the single underfill dispensing process.

9. A method comprising:
attaching a semiconductor die on a first side of a bottom package, wherein a bump of the semiconductor die is bonded on a first redistribution layer on the first side of the bottom package;
mounting the bottom package on a printed circuit board;
mounting a top package on the bottom package, wherein a width of the bottom package is greater than a width of the top package;
forming a package-on-package structure by applying a reflow process to the top package and the bottom package; and
applying a single underfill dispensing process to the package-on-package structure to form both a first underfill layer between the bottom package and the printed circuit board, and a second underfill layer between the top package and the bottom package, wherein the single underfill dispensing process is applied to an edge of the bottom package and an underfill dispensing head is vertically aligned with the edge of the bottom package during the single underfill dispensing process.

10. The method of claim 9, further comprising:
bonding the bump on the first redistribution layer through a bump on trace (BOT) process.

11. The method of claim 9, wherein:
after the step of mounting the top package on the bottom package, the semiconductor die is located between the bottom package and the top package.

12. The method of claim 9, further comprising:
depositing a molding compound layer between a bottom surface of the semiconductor die and a top surface of the bottom package.

13. The method of claim 9, wherein:
after the step of mounting the top package on the bottom package, the printed circuit board, the bottom package and the top package form a ladder shaped structure.

14. The method of claim 13, wherein:
a width of a horizontal gap between a right edge of the top package and a right edge of the bottom package is equal to one half of a diameter of the underfill dispensing head.

15. A method comprising:
attaching a semiconductor die on a first side of a bottom package, wherein the semiconductor die comprises:
an isolation layer on a substrate;
a redistribution layer on the isolation layer;
an under bump metallization structure on the redistribution layer; and
a bump on the under bump metallization structure, wherein a bottom surface of the bump is in direct contact with a top surface of a first redistribution layer on the first side of the bottom package;
mounting the bottom package on a board;
mounting a top package on the bottom package, wherein the top package is smaller than the bottom package;
forming a ladder shaped package-on-package structure by applying a reflow process to the top package and the bottom package; and
applying a single underfill dispensing process to the package-on-package structure to form both a first underfill layer between the bottom package and the board, and a second underfill layer between the top package and the bottom package, wherein the single underfill dispensing process is applied to an edge of the bottom package and an underfill dispensing head is vertically aligned with the edge of the bottom package during the single underfill dispensing process.

16. The method of claim 15, wherein:
the board is a printed circuit board.

17. The method of claim 15, further comprising:
depositing a molding compound layer between the semiconductor die and the bottom package.

18. The method of claim 15, further comprising:
mounting the top package on the bottom package through connecting a plurality of bumps of the top package to the bottom package, wherein the semiconductor die is between the plurality of bumps.

19. The method of claim 18, wherein:
a height of the plurality of bumps is greater than a height of the semiconductor die.

20. The method of claim 18, wherein:
bottom surfaces of the plurality of bumps are in direct contact with a top surface of the bottom package.

* * * * *